(12) United States Patent
Tang et al.

(10) Patent No.: US 8,047,486 B2
(45) Date of Patent: Nov. 1, 2011

(54) SUPPORT BRACKET

(75) Inventors: Xian-Xiu Tang, Shenzhen (CN); Zhen-Xing Ye, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/814,419

(22) Filed: Jun. 11, 2010

(65) Prior Publication Data

US 2011/0233360 A1 Sep. 29, 2011

(30) Foreign Application Priority Data

Mar. 29, 2010 (CN) .......................... 2010 1 0133512

(51) Int. Cl.
*A47K 1/00* (2006.01)
(52) U.S. Cl. .................................. 248/224.61; 361/687
(58) Field of Classification Search ............... 248/274.1, 248/224.61, 225.11; 312/236; 361/687; 415/108, 189; 454/184
See application file for complete search history.

(56) References Cited

U.S. PATENT DOCUMENTS

| | | | | |
|---|---|---|---|---|
| 5,208,730 A | * | 5/1993 | Tracy | 361/679.48 |
| 6,144,555 A | * | 11/2000 | Turunen | 361/690 |
| 6,556,437 B1 | * | 4/2003 | Hardin | 361/679.48 |
| 6,625,019 B1 | * | 9/2003 | Steinman et al. | 361/695 |
| 7,031,157 B2 | * | 4/2006 | Horng et al. | 361/695 |
| 7,269,006 B2 | * | 9/2007 | Miyamoto et al. | 361/679.48 |
| 7,697,287 B2 | * | 4/2010 | Yin | 361/695 |
| 7,974,078 B2 | * | 7/2011 | Coomer et al. | 361/678 |

* cited by examiner

*Primary Examiner* — Amy Sterling
*Assistant Examiner* — Erin W Smith
(74) *Attorney, Agent, or Firm* — Altis Law Group, Inc.

(57) ABSTRACT

A support bracket comprises a first frame and a second frame. The first frame comprises a bottom surface, two first sidewalls extending from opposite edges of the bottom surface, and two second sidewalls arranged between the two first sidewalls, wherein two gaps are formed in the first frame. The second frame comprises a base plate, two first side plates extending from opposite edges of the base plate, and two second side plates arranged between the two first side plates. The second frame slidably covers the first frame, the first side plates extend through the two gaps and slide along the gaps.

14 Claims, 5 Drawing Sheets

SUPPORT BRACKET

BACKGROUND

1. Technical Field

The present disclosure generally relates to device housing and, particularly, to support bracket for a plurality of electronic fans.

2. Description of Related Art

With developments in electronic technology, components in electronic devices produce increasing levels of heat, requiring prompt dissipation. Heat dissipation devices can help evacuate such heat from the electronic component. However, a commonly used single electronic fan may not furnish sufficient dissipation, and additional electronic fans may be needed.

A commonly used heat dissipation device includes a plurality of electronic fans in a fixed position. When electronic fans are to be added, the heat dissipation device may be repositioned, complicating assembly of the electronic device.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
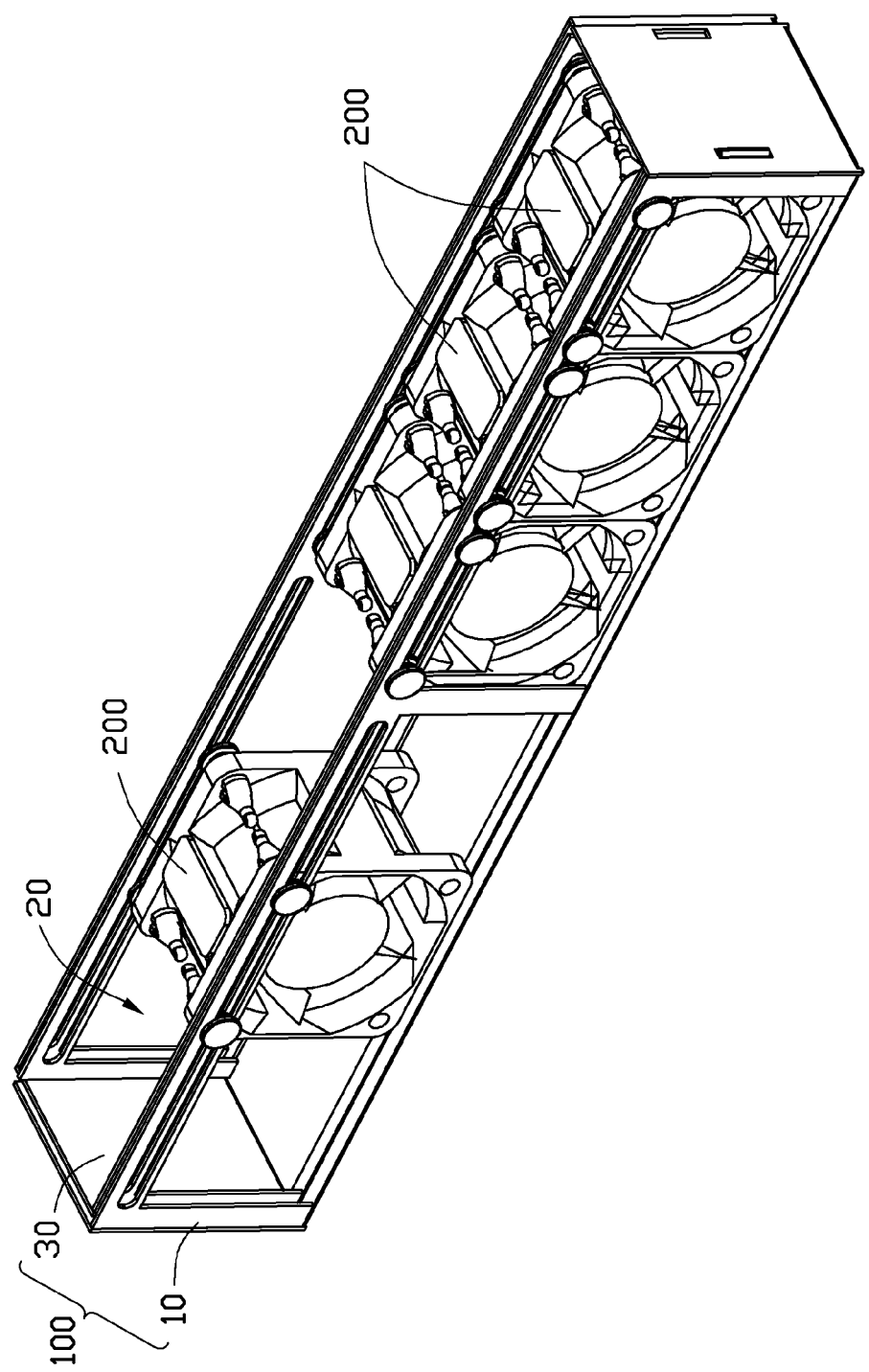
FIG. 1 is an assembled, isometric view of a support bracket as disclosed, including a first frame and a second frame and receiving a plurality of electronic fans.
Figure 2:
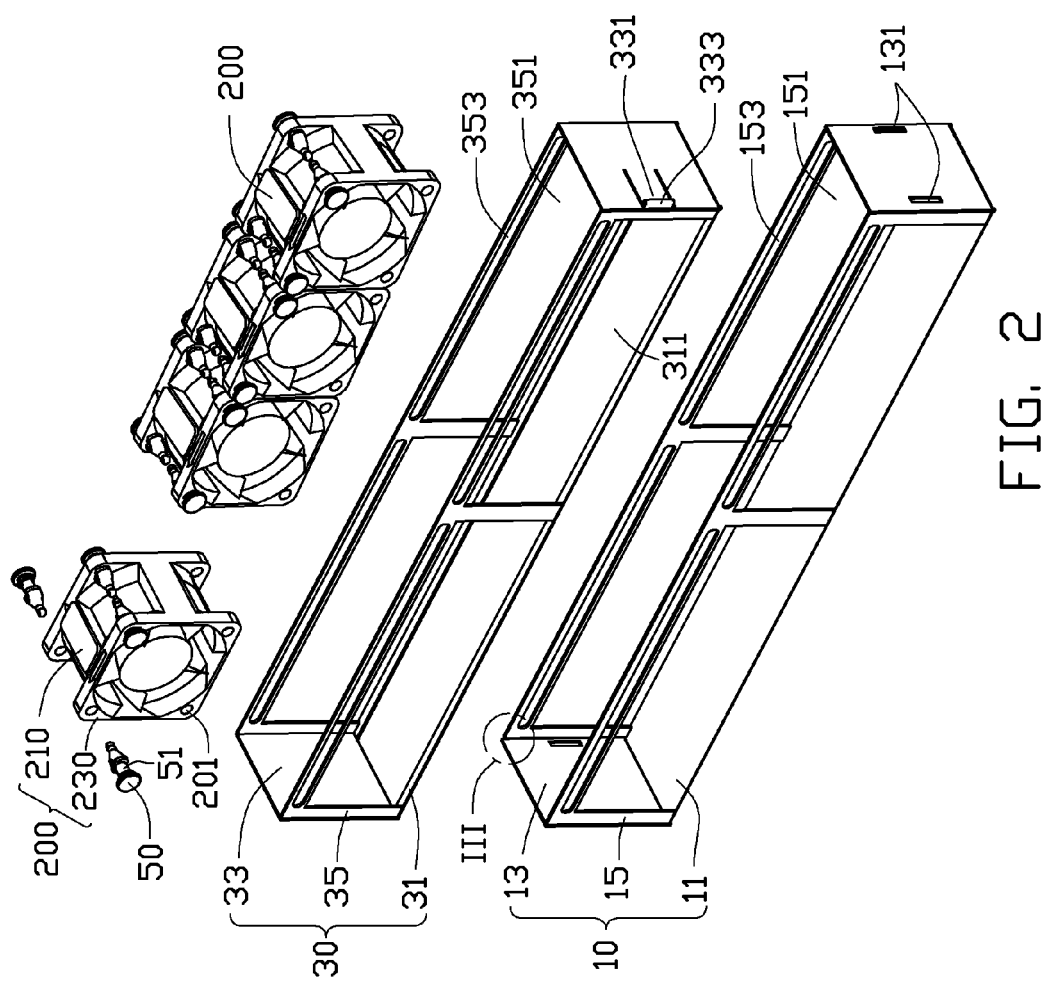
FIG. 2 is an exploded, isometric view of the support bracket and the electronic fans of FIG. 1

Referring to FIGS. 1 and 2, a support bracket 100 supports at least one electronic fan 200. The support bracket 100 includes a first frame 10, a second frame 30, and a plurality of fixing members 50.

Figure 3:
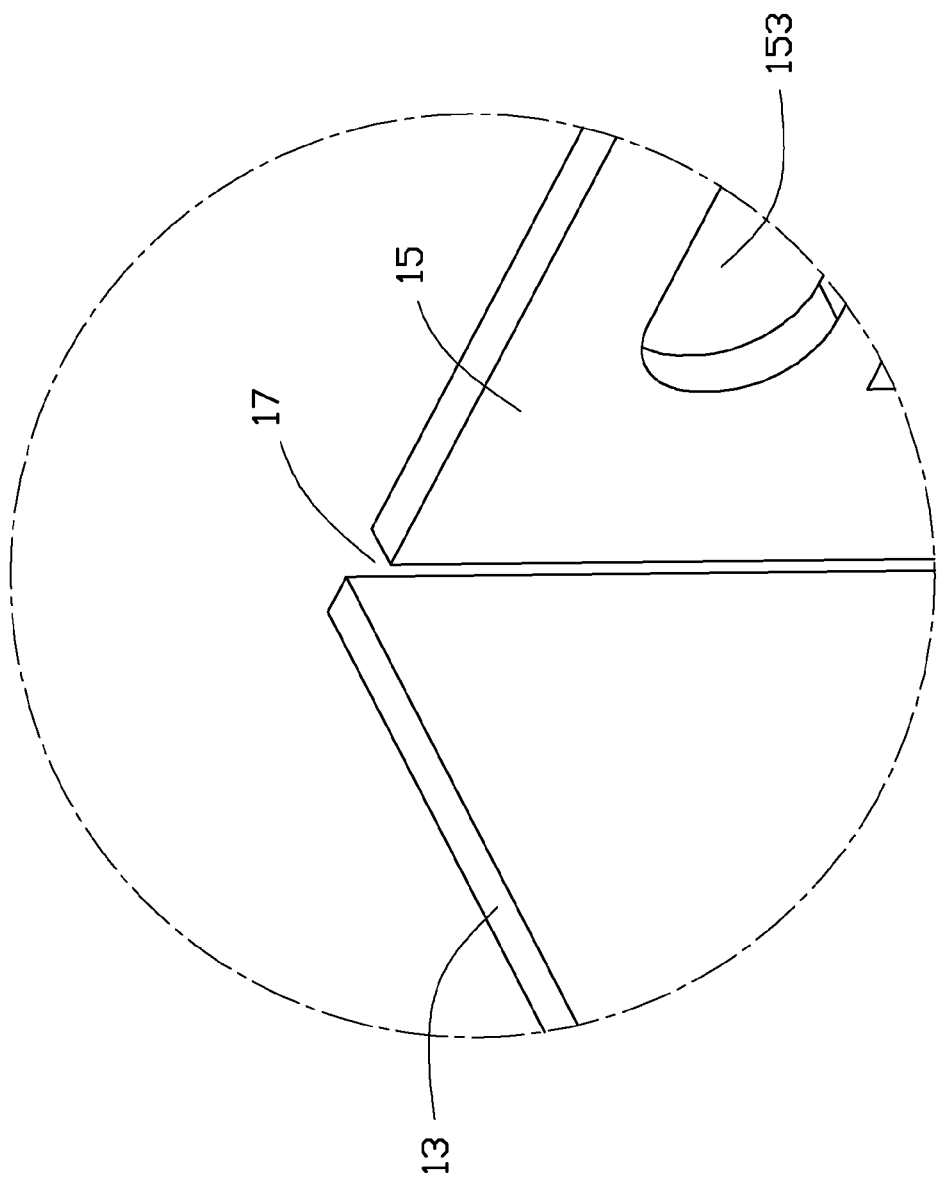
FIG. 3 is an enlarged view of part III of FIG. 2.

The first frame 10 includes a bottom surface 11, two first sidewalls 13 extending from opposite edges of the bottom surface 11, and two second sidewalls 15 extending from other opposite edges of the bottom surface 11. The second sidewalls 15 are arranged between the first sidewalls 13. The height of each first sidewall 13 is substantially the same as that of each second sidewall 15, with opposite edges of each second sidewall 15 adjacent to the two first sidewalls 13, respectively. Each first sidewall 13 defines two positioning holes 131. Each second sidewall 15 defines two first vents 151 and a slot 153 arranged over the first vents 151. At least two gaps 17 (see FIG. 3) are formed between at least one of the second sidewalls 15 and the two first sidewalls 13. In the illustrated embodiment, two gaps 17 are formed between opposite edges of one second sidewall 15 and the two first sidewalls 13, respectively.

The second frame 30 has a structure substantially the same as the first frame 10, including a base plate 31, two first side plates 33 extending from opposite edges of the base plate 31, and two second side plates 35 extending from other opposite edges of the base plate 31. The second side plates 35 are arranged between the first side plates 33. The base plate 31 defines a through hole 311. The base plate 31 is shorter than that of the bottom surface 11. The length of the first side plate 33 is the same as that of the first sidewall 13. The height of the first side plate 33 is the same as that of the second side plate 35, but less than that of the first sidewall 13. The thickness of the first side plate 33 equals or is less than the width of the gap 17 of the first frame 10. The first side plate 33 includes an elastic positioning portion 331. In the illustrated embodiment, the positioning portion 331 is formed by cutting the first side plate 33, with only one edge connected with the first side plate 33, therefore, the positioning portion 331 is elastic. The end of the positioning portion 331 includes a positioning protrusion 333 received in the positioning holes 131 of the first frame 10. Each second side plate 35 defines two second vents 351 communicating with the first vents 151 of the first frame 10 and a slide groove 353 arranged over the second vents 351.

Each fixing member 50 includes a slide portion 51 slidably received in the slot 153 of the first frame 10 or the slide groove 353 of the second frame 30. In the illustrated embodiment, each fixing member 50 is a fastener with a pliable casing, capable of absorbing impact.

Each electronic fan 200 includes a fan 210 and two fixing plates 230 arranged on opposite ends of the fan 210. Each fixing plate 230 defines four fixing holes 201 at the four corners thereof.

During assembly of the support bracket 100 and the electronic fans 200, the second frame 30 is matched with the first frame 10. The two first side plates 33 extend through the two gaps 17 of the first frame 10, and one of the second sidewalls 15 extends through the through hole 311 of the second frame 30. The base plate 31, the first side plates 33, and the second side plates 35 of the second frame 30 cover the bottom surface 11, the first sidewalls 13, and the second sidewalls 15 of the first frame 10, respectively. The positioning protrusion 333 is received in one positioning hole 131 of the first frame 10. The two first side plates 33, one second side plate 35 of the second frame 30, and one second sidewall 15 of the first frame 10 form a first receiving cavity 20 receiving the electronic fans 200. The fixing members 50 fix the electronic fans 200 to support bracket 100. The slide portions 51 of half of the fixing members 50 are slidably received in the slot 153 of the first frame 10, and the slide portions 51 of the left fixing members 50 are slidably received in the slide groove 353 of the second frame 30.

Figure 4:
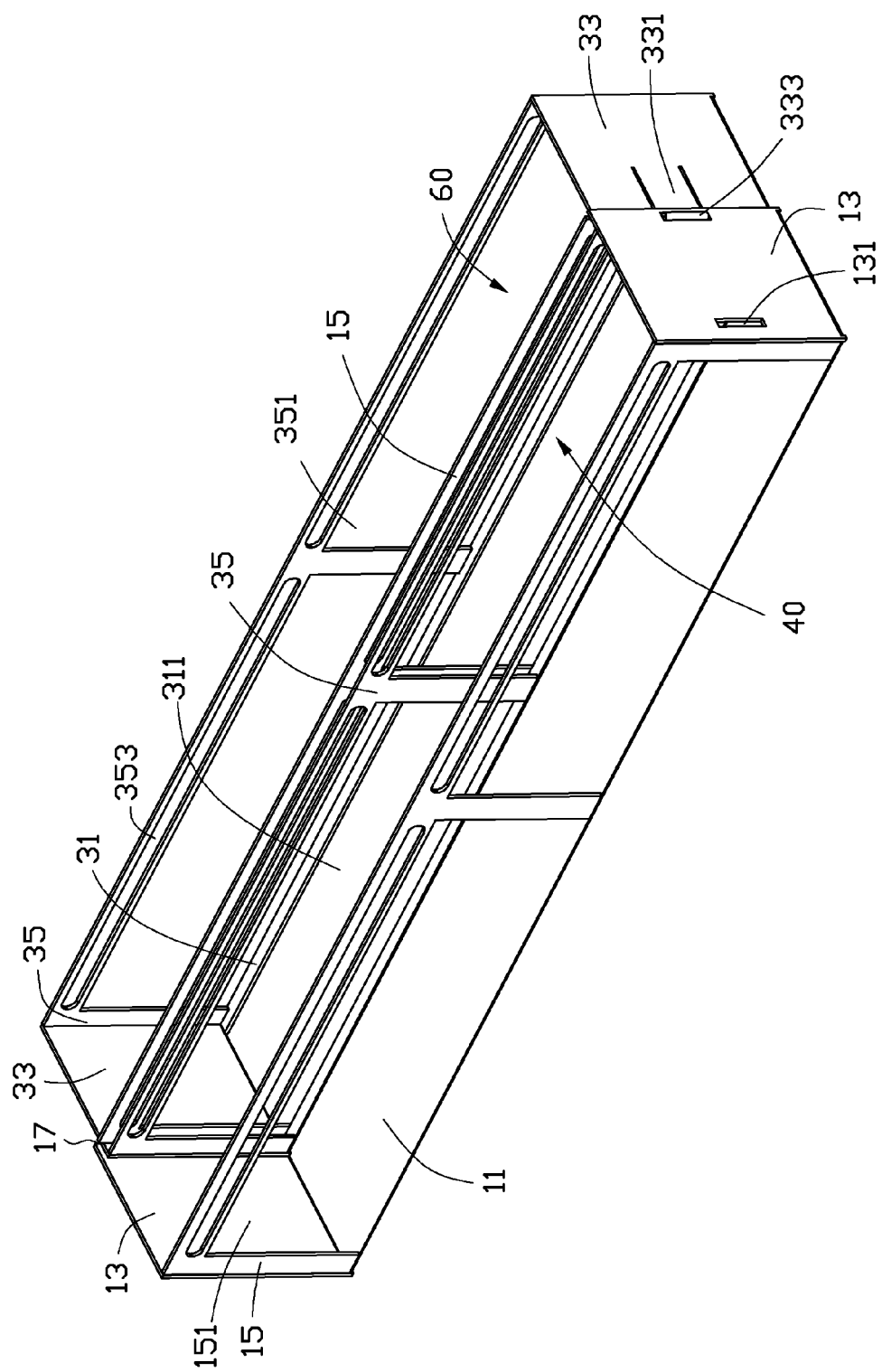
FIG. 4 shows a second state of the support bracket of FIG. 1.
Figure 5:
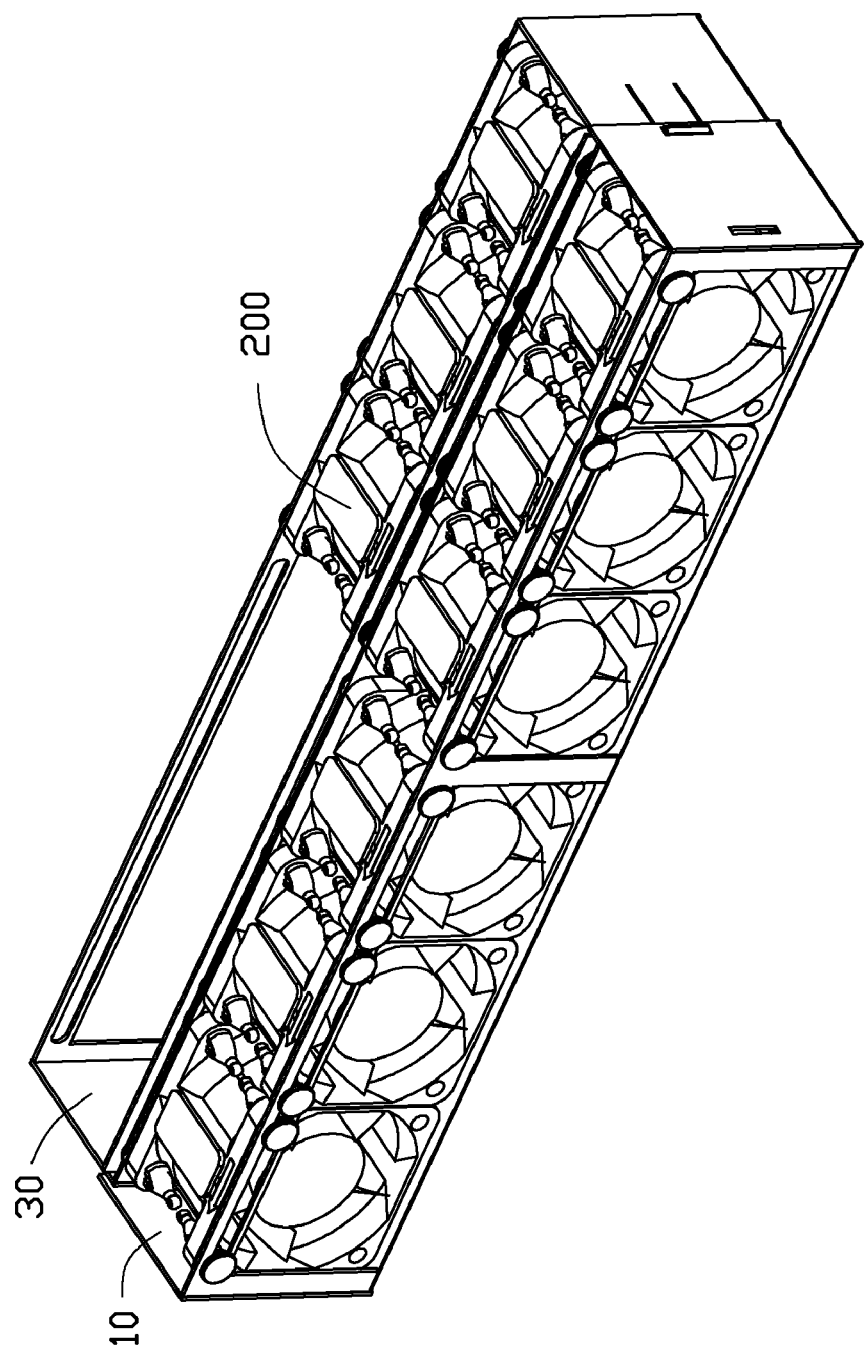
FIG. 5 is an assembled, isometric view of the support bracket of FIG. 4 receiving a plurality of electronic fans.

Referring to FIGS. 4 and 5, when more electronic fans 200 are needed, the second frame 30 can slide to one side of the first frame 10 along the gap 17 of the first frame 10 and is positioned by the positioning protrusion 333 latching with the other positioning hole 131 of the first frame 10. Therefore, the two first sidewalls 13, one second sidewall 15 of the first frame 10, and one second side plate 35 of the second frame 30 forms a second receiving cavity 40 receiving the electronic fans 200, the two first side plates 33, another second side plate 35 of the second frame 30, and another second sidewall 15 of the first frame 10 form a third receiving cavity 60 receiving the additional electronic fans 200. The electronic fans 200 are arranged in the second receiving cavity 40 and the third receiving cavity 60 of the support bracket 100. Therefore, more electronic fans 200 can be positioned in the support bracket 100, which helps dissipate heat effectively and simplifying the assembly process.

Each electronic fan 200 can slide along the slot 153 of the first frame 10 or the slide groove 353 of the second frame 30.

Therefore, the position of each electronic fan 200 can be adjusted according to heat dissipation requirements.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. A support bracket, comprising:
a first frame comprising a bottom surface, two first sidewalls extending from opposite edges of the bottom surface, and two second sidewalls arranged between the two first sidewalls, wherein each second sidewall defines at least one first vent; and
a second frame comprising a base plate, two first side plates extending from opposite edges of the base plate, and two second side plates arranged between the two first side plates, and each second side plate defines at least one second vent communicating with the at least one first vent of the first frame;
wherein the base plate defines a through hole receiving one of the second sidewall of the first frame, two gaps are formed in the first frame, the first side plates extend through the two gaps, respectively.

2. The support bracket of claim 1, wherein the two gaps are formed between the two first sidewalls and one of the second sidewall.

3. The support bracket of claim 1, wherein the length of the side plate of the second frame is shorter than that of the bottom surface of the first frame.

4. The support bracket of claim 1, wherein the length of the first sidewall of the first frame substantially equals that of the first side plate of the second frame.

5. The support bracket of claim 1, wherein each second sidewall of the first frame defines a slot, each second side plate of the second frame defines a slide groove; the support bracket further comprises a plurality of fixing members; each fixing member comprises a slide portion; the slide portions of parts of the fixing members is slidably received in the slot of the first frame, the slide portions of the left fixing members is slidably received in the slide groove of the second frame.

6. The support bracket of claim 5, wherein each fixing member is a fastener with a pliable casing.

7. The support bracket of claim 1, wherein each first side plate of the second frame comprises a positioning portion with a positioning protrusion; each first sidewall of the first frame defines two positioning holes receiving the positioning protrusion.

8. The support bracket of claim 7, wherein the positioning portion of the first side plate is formed by cutting the first side plate, with only one edge connected with the first side plate.

9. A support bracket, comprising:
a first frame; and
a second frame slidably covering the first frame;
wherein the first frame defines two gaps communicating with the exterior; the second frame comprises two first side plates and two second side plates arranged between the two first side plates; one of the second side plates is received in the first frame, and the other second side plate is arranged outside of the first frame, the first side plates extend through the two gaps, respectively, capable of sliding along the gaps.

10. The support bracket of claim 9, wherein the first frame comprises two first sidewalls and two second sidewalls arranged between the two first sidewalls.

11. The support bracket of claim 10, wherein when each first sidewall of the first frame covers one first side plate of the second frame, and each second sidewall of the first frame covers one second side plate of the second frame, the two first side plates, one second side plate, and one second sidewall cooperatively define a first receiving cavity.

12. The support bracket of claim 11, wherein when the second frame slides a predetermined distance along the gaps of the first frame, the two first sidewalls, one second sidewall, and one second side plate cooperatively define a second receiving cavity, the two first side plates, another second sidewall, and another second side plate cooperatively define a third receiving cavity.

13. The support bracket of claim 12, wherein each first side plate of the second frame comprises a positioning portion with a positioning protrusion; each first sidewall of the first frame defines two positioning holes receiving the positioning protrusion.

14. The support bracket of claim 13, wherein the positioning portion of the first side plate is formed by cutting the first side plate, with only one edge connected with the first side plate.

* * * * *